(12) United States Patent
Hoshino et al.

(10) Patent No.: US 8,436,481 B2
(45) Date of Patent: May 7, 2013

(54) HEAT-RESISTANT ADHESIVE SHEET FOR SUBSTRATELESS SEMICONDUCTOR PACKAGE FABRICATION AND METHOD FOR FABRICATING SUBSTRATELESS SEMICONDUCTOR PACKAGE USING THE ADHESIVE SHEET

(75) Inventors: Shinji Hoshino, Osaka (JP); Yukio Arimitsu, Osaka (JP); Kazuyuki Kiuchi, Osaka (JP); Akihisa Murata, Osaka (JP)

(73) Assignee: Nitto Denko Corporation, Osaka (JP)

( * ) Notice: Subject to any disclaimer, the term of this patent is extended or adjusted under 35 U.S.C. 154(b) by 278 days.

(21) Appl. No.: 12/974,620

(22) Filed: Dec. 21, 2010

(65) Prior Publication Data

US 2011/0151625 A1 Jun. 23, 2011

(30) Foreign Application Priority Data

Dec. 22, 2009 (JP) ................................. 2009-291523

(51) Int. Cl.
*H01L 23/28* (2006.01)
(52) U.S. Cl.
USPC .................... 257/787; 257/E23.116; 438/118; 438/127
(58) Field of Classification Search .................. 257/678, 257/687, 701, 723, 787, 788, 793, E23.116, 257/E23.117, E23.119, E23.121; 438/113, 438/118, 119, 127
See application file for complete search history.

(56) References Cited

U.S. PATENT DOCUMENTS 5,320,789 A * 6/1994 Nishii et al. .................. 264/446
8,119,236 B2 * 2/2012 Kamiya et al. ................ 428/343
8,217,115 B2 * 7/2012 Masuda et al. ................ 525/109
2002/0192463 A1* 12/2002 Kiuchi et al. .................. 428/343

(Continued)

FOREIGN PATENT DOCUMENTS

CN 1591809 A 3/2005
CN 102134452 A 7/2011

(Continued)

OTHER PUBLICATIONS

Communication from the a foreign patent office in counterpart CN application 201010615030.5 dated Dec. 24, 2012.

*Primary Examiner* — Jarrett Stark
*Assistant Examiner* — Michele Fan
(74) *Attorney, Agent, or Firm* — Sughrue Mion, PLLC

(57) ABSTRACT

The present invention is intended to solve the following problems with a method for fabricating a substrateless semiconductor package using an adhesive sheet as a temporary fixing supporter. A chip can be displaced from a specified position by pressure during resin encapsulation because the chip is not properly held by the adhesive sheet. If such displacement occurs, the relative positional relationship between the chip and an interconnect to be connected to a specified position in a subsequent wiring step also changes by the displacement of the chip from the specified position. Another problem is that if adhesive deposits occur during peeling of the adhesive sheet and the surface of a package is contaminated with the adhesive deposits, adhesive components left on the surface of the chip can inhibit connection between the interconnect and the chip in a subsequent wiring step. To solve these problems, the present invention provides an adhesive sheet for semiconductor device fabrication that is attached to a substrateless semiconductor chip when the chip is encapsulated with resin. The adhesive sheet includes a base material layer and an adhesive layer. The adhesive layer has a specific adhesion strength and peel strength.

6 Claims, 3 Drawing Sheets

U.S. PATENT DOCUMENTS

| | | | |
|---|---|---|---|
| 2003/0012882 A1* | 1/2003 | Tokuhisa et al. | 427/385.5 |
| 2004/0000370 A1* | 1/2004 | Kiuchi et al. | 156/77 |
| 2004/0003883 A1* | 1/2004 | Kiuchi et al. | 156/77 |
| 2005/0046021 A1 | 3/2005 | Hosokawa | |
| 2005/0136251 A1* | 6/2005 | Kishimoto et al. | 428/343 |
| 2007/0141330 A1* | 6/2007 | Morishima et al. | 428/343 |
| 2008/0063871 A1* | 3/2008 | Jung et al. | 428/414 |
| 2008/0169062 A1* | 7/2008 | Kishimoto et al. | 156/280 |
| 2011/0143552 A1 | 6/2011 | Yanagi et al. | |
| 2011/0290468 A1* | 12/2011 | Nakayama et al. | 165/185 |

FOREIGN PATENT DOCUMENTS

| | | | |
|---|---|---|---|
| EP | 1033393 A2 | * | 9/2000 |
| EP | 2078740 A1 | * | 7/2009 |
| JP | 2001-308116 A | | 11/2001 |
| JP | 2001-313350 A | | 11/2001 |
| JP | 2006160872 A | * | 6/2006 |
| JP | 2008-101183 A | | 5/2008 |
| JP | 2008101183 A | * | 5/2008 |
| JP | 2008195927 A | * | 8/2008 |

* cited by examiner

HEAT-RESISTANT ADHESIVE SHEET FOR SUBSTRATELESS SEMICONDUCTOR PACKAGE FABRICATION AND METHOD FOR FABRICATING SUBSTRATELESS SEMICONDUCTOR PACKAGE USING THE ADHESIVE SHEET

BACKGROUND OF THE INVENTION

1. Field of the Invention

The present invention relates to a heat-resistant adhesive sheet for temporarily fixing chips used in a method for fabricating substrateless semiconductor packages that do not use a metal lead frame.

2. Description of the Related Art

Among LSI packaging technologies, Chip Size/Scale Package (CSP) technologies have recently come into attention. Among those technologies, substrateless semiconductor package technology such as Wafer Level Package (WLP) is attractive in terms of packaging density and size reduction. In a WLP fabrication method, multiple semiconductor Si wafer chips orderly arranged without the use of a substrate are encapsulated with an encapsulation resin at a time and then the wafer is diced into individual structures. Thus the method enables packages smaller than conventional ones that use a substrate to be fabricated efficiently.

In such a WLP fabrication method, chips, which are conventionally fixed on a substrate, need to be fixed on an alternative supporter. Furthermore, since the chips need to be unfixed after the chips have been encapsulated with resin and formed into individual packages, the supporter need to be removable, instead of permanent bonding fixation. Attention is therefore being given to an approach to using an adhesive sheet as such a supporter for temporarily fixing chips.

For example, Japanese Patent Laid-Open No. 2001-308116 describes a chip electronic component fabrication method that includes the steps of: attaching acrylic resin adhesion means onto a substrate, the adhesive means being adhesive before processing but the adhesion strength decreases after the processing; fixing a plurality of semiconductor chips of the same type or different types onto the adhesion means with an electrode-formed surface down; coating a whole area including interspaces between the plurality of semiconductor chips of the same type or different types with a protective material; applying predetermined processing to reduce the adhesion strength of the adhesion means and peeling off a pseudo wafer on which the semiconductor chips are fixed from the semiconductor chips; and cutting the protective material between the plurality of semiconductor chips of the same type or different types to separate the semiconductor chips or chip electronic components.

Japanese Patent Laid-Open No. 2001-313350 describes a hip electronic component fabrication method that includes the steps of: attaching acrylic resin adhesion means onto a substrate, the adhesive means being adhesive before processing but the adhesion strength decreases after the processing; fixing a plurality of semiconductor chips of the same type or different types onto the adhesion means with an electrode-formed surface down; coating a whole area including interspaces between the plurality of semiconductor chips of the same type or different types with a protective material; removing the protective material from the area from the side opposite of the electrode-formed side to the side opposite of the semiconductor chips; applying predetermined processing to reduce the adhesion strength of the adhesion means and peeling off a pseudo wafer on which the semiconductor chips are fixed from the semiconductor chips; and cutting the protective material between the plurality of semiconductor chips of the same type or different types to separate the semiconductor chips or chip electronic components.

According to these methods, the protection of the chips also protects the chips during mounting/handling after dicing and the packaging density can be improved.

Japanese Patent Laid-Open No. 2008-101183 describes a dicing/die bonding tape including an adhesive layer containing epoxy resin and acrylic rubber and a method for bonding a semiconductor device resulting from dicing onto a supporter. Obviously, the method is not intended for substrateless semiconductor devices and the adhesive layer is chosen by taking into consideration the adhesiveness to a substrate.

The following problems can arise with the following method for fabricating a substrateless semiconductor package using an adhesive sheet as a temporary supporter, which do not arise with fabrication of semiconductor packages using a lead frame.

The problems will be described below with reference to FIG. 1, which illustrates the substrateless semiconductor device fabrication method.

Multiple chips 1 are attached onto a heat-resistant adhesive sheet 2 for semiconductor device fabrication. The heat-resistant adhesive sheet 2 includes an adhesive layer 12 on one side and a substrate fixing bond layer 13 on the other side. The heat-resistant adhesive sheet 2 for semiconductor device fabrication is fixed on a substrate 3 to form a structure depicted in part (a) of FIG. 1. Alternatively, the heat-resistant adhesive sheet 2 for semiconductor device fabrication is attached onto a substrate 3 and chips 1 are fixed on the heat-resistant adhesive sheet 2 to form the structure depicted in part (a) of FIG. 1.

Then, the chips 1 on the structure depicted in part (a) are encapsulated together with an encapsulation resin 4 to form a structure illustrated in part (b) of FIG. 1.

Then, as illustrated in part (c), the heat-resistant adhesive sheet 2, together with the substrate 3, is removed from the multiple chips 1 encapsulated with the encapsulation resin 4, or the multiple chips 1 encapsulated with the encapsulation resin 4 and the heat-resistant adhesive sheet 2 are removed together from the substrate 3 and then the heat-resistant adhesive sheet 2 for semiconductor device fabrication is removed from the chips 1, thereby obtaining the multiple chips 1 encapsulated with the encapsulation resin 4.

Electrodes 5 are formed in desired positions on surfaces of the chips 1 encapsulated with the encapsulation resin 4 that are exposed on the side on which the heat-resistant adhesive sheet 2 for semiconductor device fabrication is provided, thereby forming a structure depicted in part (d).

For the step of dicing, a dicing tape 8 having a dicing ring 7 provided on its encapsulation resin 4 side as required is bonded to the structure to fix the chips 1 encapsulated with the encapsulation resin 4. The structure is diced with a dicing blade 6 as depicted in part (e) to ultimately provide multiple substrateless packages in which multiple chips are encapsulated with the resin as depicted in part (f).

During the resin encapsulation, the heat-resistant adhesive sheet 2 for semiconductor device fabrication illustrated in FIG. 2(a) can be deformed in planar directions due to expansion and elasticity of a base material layer or the adhesive layer of the heat-resistant adhesive sheet 2 for semiconductor device fabrication as illustrated in FIG. 2(b). Accordingly, the positions of the chips 1 provided on the heat-resistant adhesive sheet 2 for semiconductor device fabrication can move.

As a result, when the electrodes are provided on the chips 1, relative positional relationship between the chips 1 and the electrodes would have changed from the originally designed relationship. Furthermore, during dicing of the chips 1 encapsulated with resin, the dicing line based on the positions of the chips 1 predetermined for the dicing step would be different from the dicing line required by the actual positions of the chips 1.

Consequently, the positions of chips encapsulated in the packages resulting from dicing would vary from one package to another and a subsequent electrode formation step would not smoothly be performed and partially encapsulated packages would result.

When the heat-resistant adhesive sheet 2 for semiconductor device fabrication is peeled away from the resin-encapsulated chips, an adhesive formed on the chip side of the heat-resistant adhesive sheet 2 for semiconductor device fabrication exhibits heavy peeling from the chips and the encapsulation resin, depending on the properties of the adhesive. Therefore it can be difficult to peel off the heat-resistant adhesive sheet 2 for semiconductor device fabrication, or adhesive deposits 9 as illustrated in FIG. 3 can occur or static electricity can build up during peeling.

As peeling becomes difficult, more time is required accordingly. Heavy peeling therefore can lead to reduction in productivity. Adhesive deposits 9 can inhibit a subsequent step such as electrode formation. Static electricity build-up caused by peeling leads to a problem due to adhesion of dust in a subsequent step.

As has been described, chips can be displaced from specified positions by pressure applied during resin encapsulation because the chips are not properly held in the substrateless semiconductor package fabrication method using a heat-resistant adhesive sheet 2 for semiconductor device fabrication as a supporter for temporary fixture. When the heat-resistant adhesive sheet 2 for semiconductor device fabrication is peeled off, packages can be damaged by adhesion strength to the chips increased by curing of the encapsulation material or heat.

These problems are specific to substrateless semiconductor device fabrication methods not suffered by other methods such as the method described in Japanese Patent Laid-Open No. 2008-101183.

SUMMARY OF THE INVENTION

Means for solving the problems is as follows.

A heat-resistant adhesive sheet for semiconductor device fabrication is attached to a substrateless semiconductor chip when the substrateless semiconductor chip is encapsulated with resin. The heat-resistant adhesive sheet includes a base material layer and an adhesive layer. When bonded, the adhesive layer has an adhesion strength to SUS304 greater than or equal to 0.5 N/20 mm. The adhesive layer cures by stimulation received in a period between completion of the bonding and completion of resin encapsulation so that the peel strength of the adhesive layer from package reduces to 2.0 N/20 mm or less.

The adhesive layer may be a radiation curable layer that cures under radiation such as ultraviolet or may be a radiation curable layer that cures by heat.

Furthermore, there is provided a semiconductor device fabrication method that resin-encapsulates a substrateless semiconductor chip using the heat-resistant adhesive sheet 2 for semiconductor device fabrication, instead of a metal lead frame.

The present invention provides a heat-resistant adhesive sheet 2 for semiconductor device fabrication that is used in a substrateless semiconductor package fabrication method (such as WLP fabrication method) that does not use a metal lead frame, and a semiconductor device fabrication method that uses the sheet. According to the present invention, when substrateless semiconductor chips that do not use a metal lead frame are encapsulated with resin, the chips are held so that the chips are not displaced from specified positions. Adhesive deposit is not left after the heat-resistant adhesive sheet 2 for semiconductor device fabrication has been used. Therefore, gas is not generated and an adhesive does not melt and attach during heating. Consequently, interconnects can be reliably provided, leading to improvement of fabrication yield of the semiconductor package and reduction in contamination with adhesive deposits that would otherwise occur during peeling of the sheet.

| | Description of Symbols |
|---|---|
| 1: | Chip |
| 2: | Heat-resistant adhesive sheet for semiconductor device fabrication |
| 3: | Substrate |
| 4: | Encapsulation resin |
| 5: | Electrode |
| 6: | Dicing blade |
| 7: | Dicing ring |
| 8: | Dicing tape |
| 9: | Adhesive deposit |
| 10: | Flat, smooth peeling sheet |
| 11: | Base material layer |
| 12: | Adhesive layer |
| 13: | Substrate fixing bond layer |

DETAILED DESCRIPTION OF THE PREFERRED EMBODIMENTS

To achieve the objects described above, the present inventors have diligently studied materials and configurations for a heat-resistant adhesive sheet for semiconductor device fabrication. As a result, the inventors have found that the objects described above can be achieved by using a heat-resistant adhesive sheet for semiconductor device fabrication that includes an adhesive layer having a peel strength in certain ranges before and after curing and by inducing a curing reaction of the adhesive layer by heat history experienced by the adhesive sheet in the period from completion of bonding to completion of resin encapsulation, and have made the present invention.

The present invention relates to a heat-resistant adhesive sheet for semiconductor device fabrication that is attached to a substrateless semiconductor chips that do not use a metal lead frame when the chips are encapsulated with resin. The heat-resistant adhesive sheet for semiconductor device fabrication includes a base material layer and an adhesive layer. The adhesive sheet has been designed so that the adhesive layer cures in a period from completion of bonding to completion of resin encapsulation.

In a specific heat-resistant adhesive sheet for semiconductor device fabrication, the adhesive layer contains a radiation curable adhesive or an adhesive that cures by heat. The radiation curable adhesive is preferably an ultraviolet (UV) curable adhesive.

The heat-resistant adhesive sheet for semiconductor device fabrication has been designed so that the adhesive layer cures in a period from completion of bonding to completion of resin encapsulation. Curing means is not limited to specific means. For example, a UV curable adhesive may be contained in part or all of the adhesive layer and a curing reaction of the adhesive layer containing the UV curable adhesive may be induced by heating during the resin encapsulation step.

Figure 1:
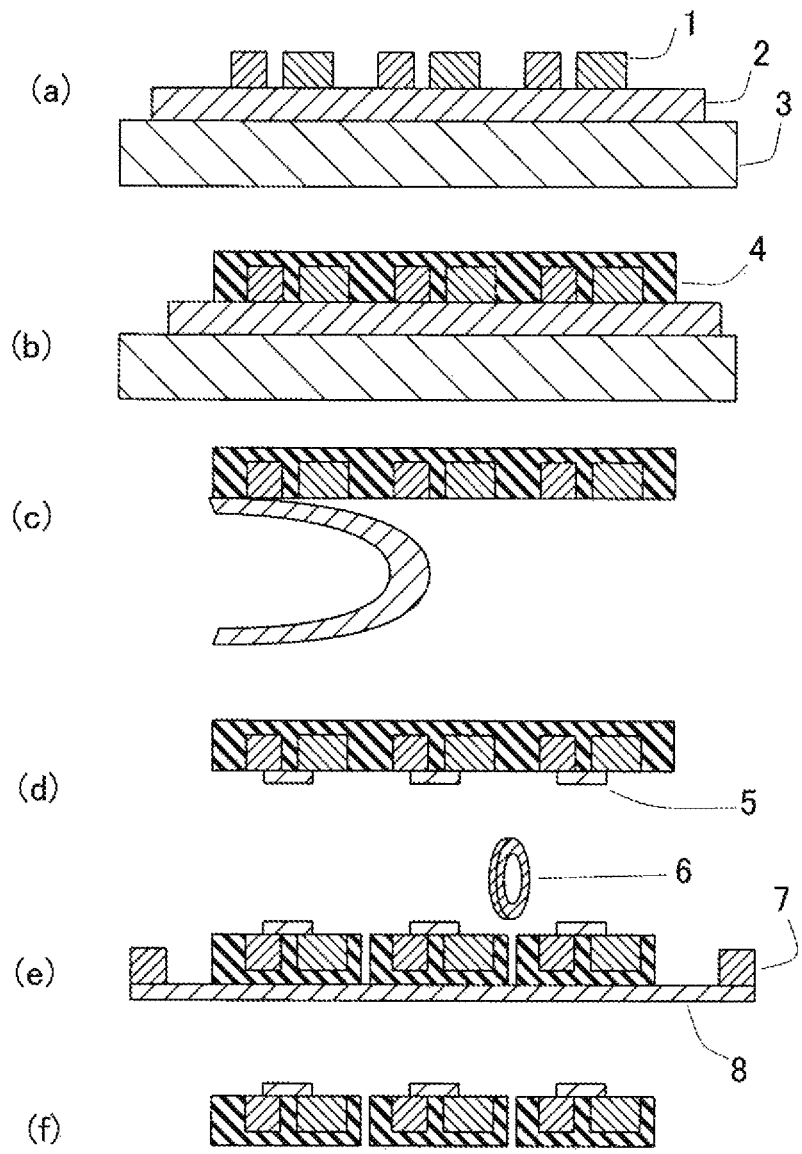
FIG. 1 is a schematic diagram of a method for fabricating a substrateless package.
Figure 2:
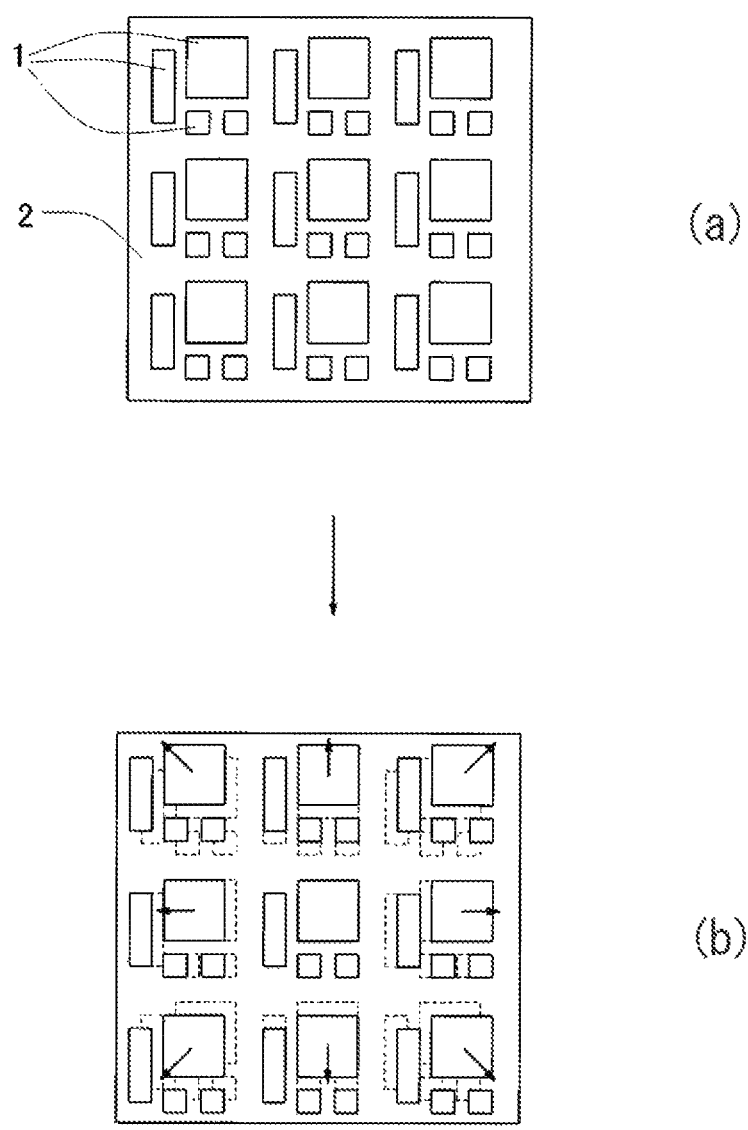
FIG. 2 is a diagram illustrating deformation of a heat-resistant adhesive sheet for semiconductor device fabrication on which chips are mounted by heat during encapsulation with encapsulation resin.
Figure 3:
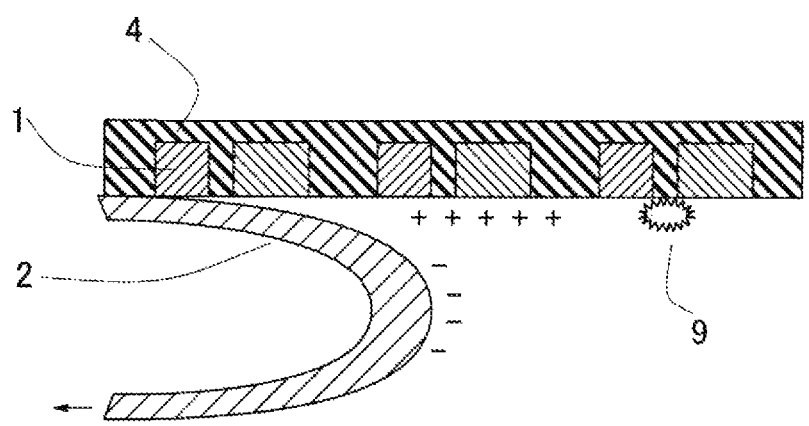
FIG. 3 is a diagram illustrating static electricity build-up and adhesive deposits that occur when a heat-resistant adhesive sheet for semiconductor device fabrication is removed.
Figure 4:
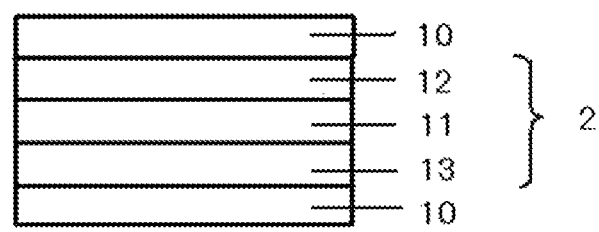
FIG. 4 is a cross-sectional view of a heat-resistant adhesive sheet for semiconductor device fabrication according to the present invention.

An embodiment of a heat-resistant adhesive sheet 2 for semiconductor device fabrication of the present invention will be described in detail with reference to FIG. 4. FIG. 4 is a cross-sectional view of the heat-resistant adhesive sheet 2 for semiconductor device fabrication including a base material layer 11 and an adhesive layer 12. A substrate fixing bond layer 13 can be formed on the surface of the base material layer on the side where the adhesive layer is not provided, so that the heat-resistant adhesive sheet 2 having chips 1 fixed on the adhesive layer 12 can be fixed on the substrate 3. The adhesive layer 12 is made of an adhesive such as an acrylic-based adhesive, an adhesive containing rubber and epoxy resin components, or a silicone resin-based adhesive.

Flat, smooth peeling sheets 10 that protect the surfaces of the adhesive layer 12 and the substrate fixing bond layer 13 can also be provided.

The heat-resistant adhesive sheet 2 for semiconductor device fabrication of the present invention will be described below.

[Adhesive Layer 12]

The adhesive of the adhesive layer 12 may be any material that is heat-resistant.

Specifically, the adhesive may be any of various adhesives such as an acrylic-based adhesive, an adhesive containing rubber and epoxy resin components, and a silicone resin-based adhesive.

The adhesive layer 12 is capable of reliably fixing chips before resin encapsulation and allows the heat-resistant adhesive sheet 2 for semiconductor device fabrication to be peeled away from resin-encapsulated chips without leaving adhesive deposits or damage to the resin.

To that end, the adhesive layer 12 needs to have an initial adhesion strength higher than or equal to 0.5 N/20 mm to SUS304 and a peel strength lower than or equal to 2.0 N/20 mm from package after curing. The adhesive layer 12 has an initial adhesion strength of preferably higher than or equal to 0.6 N/20 mm to SUS304, more preferably higher than or equal to 0.8 N/20 mm and has a peel strength preferably lower than or equal to 1.0 N/20 mm from package, more preferably lower than or equal to 0.85 N/20 mm, yet more preferably lower than or equal to 0.5 N/20 mm.

The peel strength from package herein is primarily the peel strength from cured encapsulation resin of the package because the cured encapsulation resin has a greater area adhered to the adhesive layer 12 of the heat-resistant adhesive sheet 2 for semiconductor device fabrication than the area adhered to the chips, although the adhesive layer 12 of the heat-resistant adhesive sheet 2 for semiconductor device fabrication is adhered to both of the cured encapsulation resin and the chips.

Acrylic Resin-Based Adhesive

Examples of the acrylic resin-based adhesive include an acrylic copolymer derived from copolymerization of monomers containing at least alkyl(meth)acrylate. Examples of alkyl(meth)acrylate include methyl(meth)acrylate, ethyl (meth)acrylate, butyl(meth)acrylate, isoamyl(meth)acrylate, n-hexyl(meth)acrylate, 2-ethyl hexyl(meth)acrylate, isooctyl (meth)acrylate, isononyl(meth)acrylate, decyl(meth)acrylate, and dodecyl(meth)acrylate.

Alkyl(meth)acrylate is an alkyl acrylate and/or alkyl methacrylate. The same applies to (meth) in all compound names herein.

The acrylic resin-based adhesive may contain any appropriate known cross-linking agent.

Examples of the cross-linking agent include an isocyanate cross-linking agent, an epoxy cross-linking agent, an aziridine-based cross-linking compound, and a chelate-based cross-linking agent.

The content of the cross-linking agent is not limited. Specifically, for example the content of the cross-linking agent is preferably 0.1 to 15 pts.wt., more preferably 0.5 to 10 pts.wt, for 100 pts.wt. of the content of the acrylic-based copolymer stated above. If the content of cross-linking agent is greater than or equal to 0.1 pts.wt., the adhesive layer 12 will have an appropriate level of viscoelasticity and therefore the adhesion strength of the adhesive layer 12 to conductive patterns on the surfaces of the chips or to the encapsulation resin 4 will not become excessively high. Therefore the encapsulation resin 4 will not be peeled off or damaged when the heat-resistant adhesive sheet 2 for semiconductor device fabrication is peeled off. Furthermore, portions of the adhesive layer 12 cannot adhere to and remain on the conductor patterns on the surfaces of the chips or encapsulation resin 4. On the other hand, if the content of the cross-linking agent is less than or equal to 15 pts.wt, cracks of the adhesive layer 12 due to excessive cure of the adhesive layer 12 cannot occur.

By containing a radiation curable adhesive in the adhesive layer 12, the resin can be cured by heat during resin encapsulation and/or post cure.

The radiation curable adhesive is preferably a UV curable compound that can be cured under irradiation of ultraviolet and is efficiently reticulated three-dimensionally by UV irradiation.

Examples of such a UV curable compound include trimethylolpropane triacrylate, tetramethylolmethane tetraacrylate, pentaerythritol monohydroxy pentaacrylate, 1,4-butylenes glycol diacrylate, 1,6-hexanediol diacrylate, and polyethylene glycol diacrylate. A UV curable compound that contains more functional groups having an unsaturated bond which is a reaction site is more preferable. Especially preferable is a compound containing six or more functional groups. These compounds can be used either singly or in combination.

The UV curable compound may be a UV curable resin. Examples of the UV curable compound include a photosensitive reactive group-containing polymer or oligomer, such as ester(meth)acrylate, urethane(meth)acrylate, epoxy(meth) acrylate, melamine(meth)acrylate, and acrylic resin (meth) acrylate, thiol-ene added resin and cationic photopolymerization-type resin having an allyl group at the molecular end thereof, a cinnamoyl group-containing polymer such as polyvinyl cinnamate, diazotized amino novolac resin, and an acrylamide type polymer. Examples of polymer reactive to UV include epoxidized polybutadiene, unsaturated polyester, polyglycidyl methacrylate, polyacrylamide, and polyvinyl siloxane.

The content of the UV curable compound is preferably 5 to 500 pts.wt., more preferably 15 to 300 pts.wt., and especially preferably 20 to 150 pts.wt., for 100 pts.wt. of adhesive.

Rubber-Component and Epoxy Resin-Based Adhesive (Rubber Component)

Examples of the rubber component of the rubber and epoxy resin components containing adhesive agent constituting the adhesive layer 12 include rubber components conventionally used in epoxy-based bonds, such as NBR (acrylonitrile-butadiene rubber), acrylic rubber, acid terminated nitrile rubber, and thermoplastic elastomer. Examples of commercially available rubber components include NiPol 1072 (from Zeon Corporation) and Nipol-AR51 (from Zeon Corporation). Among them, NBR is preferably used in terms of compatibility with epoxy resin. In particular, NBR having an acrylic nitrile content of 10 to 50% is preferable.

The aim of addition of the rubber component is to provide flexibility to the adhesive. However, the heat resistance decreases as the content of the rubber component increases. In view of this, the proportion of the rubber component in the organic substance in the adhesive layer 12 is preferably 20 to 60 wt %, more preferably 30 to 50 wt %. A proportion of 20 wt % or more adds flexibility to the adhesive layer 12 and provides a good machinability in cutting of the adhesive sheet. A proportion of 60 wt % or less provides a sufficient heat resistance and can prevent adhesives deposit.

(Epoxy Resin Component)

Examples of the epoxy resin component used with the rubber component include a compound containing two or more epoxy groups in its molecule, such as glycidyl amine-type epoxy resin, bisphenol F-type epoxy resin, bisphenol A-type epoxy resin, phenol novolac-type epoxy resin, cresol novolac-type epoxy resin, biphenyl-type epoxy resin, naphthalene-type epoxy resin, aliphatic epoxy resin, acrylic epoxy resin, heterocyclic epoxy resin, spiro-ring-containing epoxy resin, and halogenated epoxy resin. These components can be used either singly or in combination. Among these, bisphenol A-type epoxy resin is especially preferable in terms of peelability from the encapsulation resin 4 after the encapsulation step.

The proportion of the epoxy resin used is preferably 40 to 80 wt %, more preferably 50 to 70 wt %, for 100 pts.wt. of organic substance. A proportion of 40 wt % or more can provide a sufficient heat resistance to the adhesive layer 12 by curing and a proportion of 80 wt. or less can provide flexibility and improve the machinability. The epoxy resin has a weight per epoxy equivalent of less than or equal to 1000 g/eq, preferably less than or equal to 500 g/eq. A weight per epoxy equivalent of 1000 g/eq or less can prevent adhesive deposits during peeling after the encapsulation step because the crosslink density is not decreased and bonding strength after curing falls within an appropriate range.

Silicone Resin-Based Adhesive

Preferably, the silicone resin-based adhesive has a storage elastic modulus greater than or equal to $5.0 \times 10^3$ N/cm$^2$ at 200° C. The silicone resin-based adhesive layer 12 is preferably 1 to 50 μm thick and preferably has an adhesion strength in the range of 0.05 to 4.0 N/20 mm after heating at 200° C. in conformity with JIS C2107.

Such an adhesive layer 12 may be an addition-polymerized silicone resin adhesive layer 12 cross-linked by an organo polysiloxane structure, preferably a dimethyl polysiloxane structure, and an unsaturated group such as a vinyl group, and a SiH group and cured by a platinum-based catalyst, or a silicone resin-based adhesive layer 12 obtained by curing by an organic peroxide such as BPO. However, an addition-polymerized silicone resin adhesive layer is preferable in terms of heat resistance. In that case, the crosslink density can be adjusted according to the density of the unsaturated groups by taking into account the adhesion strength that can be obtained.

Heating or other processing is required for enabling addition polymerization to form the silicone resin-based adhesive layer 12.

Since a large difference between the adhesion strength to silicone and the adhesion strength to the encapsulation resin can cause static electricity build-up, it is desirable that the adhesion strengths to the silicone and the encapsulation resin be as close to each other as possible. Therefore the adhesion strengths to them need to be within the ranges enumerated above.

Since the thermal expansivity of the silicone resin-based adhesive layer is small, the amount of displacement of chips after resin encapsulation is small. The amount is less than or equal to 3 mm, preferably 0.1 mm.

If packages are contaminated with gas generated from the adhesive layer 12 of the heat-resistant adhesive sheet 2 for semiconductor device fabrication in the step of curing the encapsulation resin by heat, the reliability of the packages can degrade due to poor plating during rewiring. Therefore, a reduction in the weight of the adhesive layer 12 at 180° C. is maintained at less than or equal to 3.0 wt %, preferably less than or equal to 2.0 wt %.

Other Components

In addition to the components described above, appropriate additives may be added to the adhesive layer 12, such as a UV polymerization initiator for curing a UV curable compound or a thermal polymerization initiator, as required. An appropriate known polymerization initiator can be chosen as the UV polymerization initiator. The content of the polymerization initiator is preferably 0.1 to 10 pts.wt., more preferably 1 to 5 pts.wt., for a 100 pts.wt. of adhesive. A UV polymerization accelerator may be added along with the UV polymerization initiator as required.

Other optional components may be added, such as a plasticizer, a pigment, a dye, an anti-aging agent, an antistatic agent, and other additives, such as filler, for improving the physical properties, such as the elastic modulus of the adhesive layer 12. In particular, addition of conductive filler can improve the elastic modulus of the adhesive layer 12 and also prevent static electricity build-up caused by peeling. In particular, an anti-aging agent may be added in order to prevent deterioration at high temperatures.

The thickness of the adhesive layer 12 is normally on the order of 1 to 50 μm, more preferably 5 to 30 μm.

[Base Material Layer 11]

A material for the base material layer 11 is not limited to a particular type. Any base material that is heat-resistant under heating conditions during resin encapsulation can be used. Since the resin encapsulation step is performed typically at a temperature around 175° C., a base material used is preferably heat-resistant so that the base material does not significantly contract or the base material layer 11 itself is not damaged at such temperatures. Accordingly, the base material has preferably a linear thermal expansion coefficient of $0.8 \times 10^{-5}$ to $5.6 \times 10^{-5}$/K at a temperature of 50 to 250° C.

If a base material that has a glass transition temperature lower than the heating temperature for curing the encapsulation resin 4 is used as the base material, the linear thermal expansion coefficient of the base material in a range of temperatures higher than the glass transition temperature will be higher than the linear thermal expansion coefficient in a range of temperatures lower than the glass transition temperature. Accordingly, displacement of adhered chips 1 from specified positions will increase.

In addition, a uniaxially- or biaxially-stretched base material, which was stretched at a temperature higher than its glass transition temperature, starts contracting at a temperature lower than the glass transition temperature, which also increases displacement from the specified positions of the adhered chips. The positional accuracy of the chips can be improved by choosing a material that has a glass transition temperature higher than 180° C. as the material of the base material layer 11 of the heat-resistant adhesive sheet 2 which is attached to the substrateless semiconductor chips without a metal lead frame when the chips are encapsulated with resin can.

Examples of such a base material include heat-resistant plastic films such as a polyethylene naphthalate (PEN) film, polyethylene sulfone (PES) film, polyetherimide (PEI), a polyethersulfone (PSF) film, a polyphenylene sulfide (PPS) film, a polyether ether ketone (PEEK) film, a polyarylate (PAR) film, an aramid film, and liquid crystal polymer (LCP).

If the temperature at which the resin encapsulation is performed is less than or equal to 150° C., a polyethylene terephthalate (PET) film can be used.

The heat-resistant base material layer 11 may be made of a paper base material such as glassine paper, quality paper, or Japanese paper, or nonwoven fabric base material of cellulose, polyamide, polyester, aramid, or the like, or a metal film base material such as aluminum foil, SUS foil, or Ni foil. These materials may be stacked to form the base material layer 11.

The thickness of the base material layer 11 is at least 5 μm, preferably 10 to 200 μm, more preferably 25 to 100 μm, in order to prevent a rip and break. A thickness greater than or equal to 5 μm provides a good handling ability and a thickness less than or equal to 200 μm is advantageous in terms of cost.

[Substrate Fixing Bond Layer 13]

A bond used for the substrate fixing bond layer 13 may be the same resin as the resin used for the adhesive layer 12 or may be a material that has such adhesion strength that the substrate fixing bond layer 13 can be peeled away from the substrate or the base material layer 11.

Peeling of the heat-resistant adhesive sheet 2 away from the substrate 3 can be facilitated by heating if for example a blowing agent that is foamed by heat is added to the substrate fixing bond layer 13. Instead of means that changes by heat, a component that forms cross-links under UV irradiation, for example, can be added to the substrate fixing bond layer 13 beforehand so that the substrate fixing bond layer 13 is cured, thereby reducing adhesion strength of the substrate fixing bond layer 13.

By such treatment, the adhesion strength of the substrate fixing bond layer 13 is reduced to separate the substrate 3 and the substrate fixing bond layer 13 from each other, or to separate the base material layer 11 and the substrate fixing bond layer 13 from each other, thereby removing the chips encapsulated with resin from the substrate 3.

[Flat, Smooth Peeling Sheet 10]

The flat, smooth peeling sheet 10 is formed of a base material film having a peeling agent layer formed on one side of the base material film and is peeled to expose the adhesive layers on both sides before the heat-resistant adhesive sheet 2 for semiconductor device fabrication is used.

The peeling agent layer contains a known peeling agent, such as a known fluorinated silicone resin-based peeling agent, a fluororesin peeling agent, a silicone resin-based peeling agent, polyvinyl alcohol-based resin, polypropylene-based resin, or long-chain alkyl compound, chosen according to the type of resin of the adhesive layer.

The base material film may be any known film chosen from plastic films, such as polyether ketone, polyetherimide, polyarylate, polyethylene naphthalate, polyethylene, polypropylene, polybutene, polybutadiene, polymethylpentene, polyvinyl chloride, vinyl chloride copolymer, polyethylene terephthalate, polybutylene terephthalate, polyurethane, ethylene vinyl acetate copolymer, ionomeric resin, ethylene-(meth)acrylic acid copolymer, ethylene-(meth)acrylic acid ester copolymer, polystyrene, and polycarbonate films.

[Fabrication of Heat-Resistant Adhesive Sheet 2 for Semiconductor Device Fabrication]

According to the present invention, compositions prepared as described above can be used to form a heat-resistant adhesive sheet 2 for semiconductor device fabrication by any of method generally used for fabricating a multilayer structure. In one method, an adhesive in a solventless state or dissolved in a reactive solvent is applied on a base material film, then is dried by heating to form the heat-resistant adhesive sheet 2 for semiconductor device fabrication. Any of the heat-resistant base materials enumerated above is suitable as the material of the base material layer. An adhesive layer to be formed on the other side of the base material layer can be formed in the same way described above.

Alternatively, an adhesive may be poured onto a peeling film or the like to form each individual film and the films may be stacked in sequence, or the application of an adhesive liquid described above may be combined with the stacking of individual films. Here, the solvent used is not limited particularly. Given that the material of the adhesive layer 12 has a good solubility, a ketone-based solvent such as methyl ethyl ketone is used preferably. Alternatively, the material may be an aquatic dispersion solution. The aquatic dispersion solution may be applied to the base material layer 11 and dried by heat. The process may be repeated to form the adhesive layer 12, thereby forming the heat-resistant adhesive sheet 2 for semiconductor device fabrication.

The heat-resistant adhesive sheet 2 for semiconductor device fabrication of the present invention includes the adhesive layer thus formed to a typical thickness of 1 to 50 μm on the base material layer.

The heat-resistant adhesive sheet 2 for semiconductor device fabrication can be provided with an antistatic function as required.

A method for providing an antistatic function to the heat-resistant adhesive sheet 2 for semiconductor device fabrication will be described.

One method for providing the antistatic function is to add an antistatic agent or conductive filler to the adhesive layer 12 and the base material layer 11. Another method is to apply an antistatic agent to the interface between the base material layer 11 and the adhesive layer 12 or the other surface of the base material layer 11 on which the adhesive layer 12 is not provided.

The antistatic function can reduce static electricity build-up caused when the heat-resistant adhesive sheet 2 for semiconductor device fabrication is removed from the semiconductor device. The antistatic agent may be any agent that has the antistatic capability. Examples of the antistatic agent include surfactants such as acrylic-based ampholytic, acrylic-based cation, and maleic anhydride-styrene-based anion.

Examples of the material for the antistatic layer include Bondeip PA, Bondeip PX, and Bondeip P (from Konishi Co., Ltd.). The conductive filler may be a conventional one, for example a metal such as Ni, Fe, Cr, Co, Al, Sb, Mo, Cu, Ag, Pt, or Au, or an alloy or oxide of any of these, or a carbon such as carbon black. These materials can be used either singly or in combination.

The conductive filler may be powdery or fibrous filler.

The heat-resistant adhesive sheet 2 for semiconductor device fabrication thus fabricated has an excellent heat resistance and a good demoldability from packages and therefore is suited for use in a semiconductor device manufacturing process.

[Semiconductor Chip Bonding Step]

The peeling sheets 10 are removed from both sides of the heat-resistant adhesive sheet 2 for semiconductor device fabrication, and the substrate fixing bond layer 13 is bonded onto the substrate so that the adhesive layer 12 is exposed at the top.

Predetermined semiconductor chips 1 to be encapsulated with resin are placed and bonded on the adhesive layer 12 in a desired arrangement, thereby fixing the semiconductor chips 1 onto the adhesive layer 12 of the heat-resistant adhesive sheet 2 for semiconductor device fabrication. Here, the structure, shape, dimensions and the like of the semiconductor chips 1 are not limited to particular ones.

[Encapsulation Step]

Encapsulation resin 4 used in the encapsulation step in which the heat-resistant adhesive sheet 2 for semiconductor device fabrication of the present invention is used may be any known encapsulation resin such as epoxy resin. The melting temperature and curing temperature of resin powder or the curing temperature of a liquid resin are chosen by taking into account the heat resistance of the heat-resistant adhesive sheet 2 for semiconductor device fabrication. The heat-resistant adhesive sheet 2 for semiconductor device fabrication of the present invention is resistant to temperatures at which commonly-used encapsulation resins 4 cure and melt.

The encapsulation step is performed in a mold by using any of the resins enumerated above for chip protection at a temperature from 170 to 180° C., for example.

Then post-mold cure is performed before the heat-resistant adhesive sheet 2 for semiconductor device fabrication is peeled away.

[Peeling Step]

After the chips 1 fixed on the heat-resistant adhesive sheet 2 for semiconductor device fabrication on the substrate have been encapsulated with the resin, the structure is heated at a temperature in the range of 200 to 250° C. for 1 to 90 seconds (in the case of a hot plate) or 1 to 15 minutes (in the case of hot-air drier) to expand the substrate fixing bond layer 13 of the heat-resistant adhesive sheet 2 for semiconductor device fabrication, thereby reducing the bonding force between the substrate fixing bond layer 13 of the heat-resistant adhesive sheet 2 for semiconductor device fabrication and the substrate 3 to separate the heat-resistant adhesive sheet 2 and the substrate 3 from each other. Alternatively, the bonding force between the base material layer 11 of the heat-resistant adhesive sheet 2 for semiconductor device fabrication and the substrate fixing bond layer 13 is reduced to separate the base material layer 11 and the substrate fixing bond layer 13 from each other.

Then the heat-resistant adhesive sheet 2 for semiconductor device fabrication is peeled away from the layer in which the chips are encapsulated with the resin.

Alternatively, instead of separating the heat-resistant adhesive sheet 2 for semiconductor device fabrication and the substrate 3, the chips 1 encapsulated with the resin 4 may be separated from the adhesive layer 12 of the heat-resistant adhesive sheet 2 for semiconductor device fabrication.

[Electrode Forming Step]

Then, screen printing or other method is used to form electrodes 5 in predetermined positions on the chips 1 on the side on which the heat-resistant adhesive sheet 2 was stacked and one surface of each of the chips 1 in the layer in which the chips 1 are encapsulated with the resin 4 is exposed. The electrodes 5 can be made of a known material.

[Dicing Step]

The layer in which the chips 1 are encapsulated with the resin 4 is fixed on a dicing sheet 8 on which preferably a dicing ring 7 is provided, then the layer is diced into packages with a dicing blade 6 for use in a typical dicing process. In doing so, if the chips 1 are not located in predetermined positions, the electrodes will be formed inaccurately, the locations of the chip 1 in each package will be inaccurate, or worse still, the dicing blade 6 can come into contact with the chips during the dicing.

The heat-resistant adhesive sheet 2 for semiconductor device fabrication of the present invention can prevent displacements of the chips 1 during the encapsulation with the encapsulation resin 4. Accordingly, the dicing step can be performed without the problems stated above and consequently packages in which the chips 1 are accurately positioned in the encapsulation resin 4 can be provided.

The present invention will be described below with respect to working examples thereof. However, the present invention is not limited by these working examples.

WORKING EXAMPLES

[Measuring Method]

Measurements and evaluations in working examples and comparative examples were made as follows.

Initial adhesion strength to SUS: Peel adhesion strength to a SUS304BA plate at an angle of 180° at room temperature Adhesion strength to SUS304 after heating: Peel adhesion strength at an angle of 180° after attached to a SUS304BA plate and heated at 150° C. for 60 minutes Adhesion strength to SUS304 at 175° C.: Peel adhesion strength to a SUS304BA plate at 175° C.

Peel strength from package: Peel adhesion strength at an angle of 180° when the adhesive sheet is peeled from the package Chip displacement: Displacement from the initial position of a chip measured with a digital microscope after package fabrication Adhesive deposit: The surface of the package was visually checked for adhesive deposits after the adhesive sheet was peeled off.

The term "part" in the following description means "part by weight".

Working Example 1

3 pts.wt. of acrylic acid monomer as a component monomer was blended with 100 pts.wt. of butyl acrylate monomer to derive an acrylic-based copolymer. 3 pts.wt. of an epoxy-based cross-linking agent (Tetrad-C from Mitsubishi Gas Chemical Company, Inc.) and 5 pts.wt. of an isocyanate-based cross-linking agent (Coronate L from Nippon Polyurethane Industry Co., Ltd.) were blended with 100 pts.wt. of the acrylic-based copolymer to prepare an acrylic-based adhesive. 50 pts.wt. of a UV curable compound (UV-1700B from Nippon Synthetic Chemical Industry Co., Ltd.) and 3 pts.wt. of UV curing initiator (Irgacure 651 from NAGASE & CO., LTD.) were added to the acrylic-based adhesive to prepare an adhesive composition.

Then, the adhesive composition was applied to a 25-μm-thick polyimide film (Kapton 100H from Du Pont-Toray Co., Ltd.) serving as the base material layer, and then dried to prepare a heat-resistant adhesive sheet for semiconductor device fabrication with an adhesive layer with a thickness approximately 10 μm.

A 5 mm×5 mm Si wafer chip was placed on the heat-resistant adhesive sheet for semiconductor device fabrication, epoxy-based encapsulation resin powder (GE-7470LA from Nitto Denko Corporation) was sprinkled over the sheet and the wafer chip, and molded by heating at a temperature of 175° C. and a pressure of 3.0 kg/cm² for 2 minutes. Then, curing of the resin was accelerated by heating at 150° C. for 60 minutes (post-mold cure) to complete the package.

Comparative Example 1

A package was fabricated in the same way as in Working Example 1, except that an adhesive sheet was peeled away before post-mold cure.

Comparative Example 2

3 pts.wt. of acrylic acid monomer as a component monomer was blended with 100 pts.wt. of butyl acrylate monomer to prepare an acrylic-based copolymer. 0.6 pts.wt. of an epoxy-based cross-linking agent (Tetrad-C from Mitsubishi Gas Chemical Company, Inc.) and 2 pts.wt. of isocyanate-based cross-linking agent (Coronate L from Nippon Polyurethane Industry Co., Ltd.) were added to 100 pts.wt. of the acrylic-based copolymer to prepare an adhesive composition. The rest of the method for fabricating the package was the same as that in Working Example 1.

Comparative Example 3

3 pts.wt. of acrylic acid monomer was added as a component monomer to 100 pts.wt. of butyl acrylate monomer to obtain an acrylic-based copolymer. 3 pts.wt. of an epoxy-based cross-linking agent (Tetrad-C from Mitsubishi Gas Chemical Company, Inc.) and 5 pts.wt. of an isocyanate-based cross-linking agent (Coronate L from Nippon polyurethane Industry Co., Ltd.) were added to 100 pts.wt. of the acrylic-based copolymer to prepare an adhesive composition. The rest of the method for fabricating the package was the same as that in Working Example 1.

Results from Working Example 1 and Comparative Examples 1 to 3 are listed in Table 1 given below.

TABLE 1

| | Unit | Working example 1 | Comparative example 1 | Comparative example 2 | Comparative example 3 |
|---|---|---|---|---|---|
| Initial adhesion strength to SUS304 | N/20 mm | 0.71 | 0.71 | 0.80 | 0.24 |
| Adhesion strength to SUS304 after heating | N/20 mm | 0.35 | 0.35 | 2.62 | 1.22 |
| Peel strength from package | N/20 mm | 0.64 | 2.37 | 3.19 | 1.88 |
| Chip displacement | mm | 0.1 | 0.1 | 0.5 | 2.5 |
| Adhesive deposit | — | Not found | Found | Found | Not found |

According to Working Example 1, a sufficient initial adhesion strength was achieved to suppress chip displacement. The adhesion strength was reduced because the adhesive was cured by heating during the post-mold cure. As a result, a light peel strength was achieved and a good package without an adhesive deposit after the peeling was successfully obtained.

In Comparative Example 1, chip displacement was suppressed because of a sufficient initial adhesion strength as in Working Example 1. However, the peel strength was higher than that of Working Example 1 and adhesive deposits after the peeling occurred, because the sheet was peeled off with the adhesive being uncured before the post-mold cure.

In Comparative Example 2, chip displacement was suppressed because the initial adhesion strength was high as in Working Example 1. However, since the adhesive used was not UV curable, adhesive strength reduction associated with curing of the adhesive by heating did not occur. Accordingly, the adhesion strength after heating was higher than the initial adhesion strength. Consequently, the peel strength from the package was high and adhesive deposit was left after the peeling.

In Comparative Example 3, since the adhesive was not UV curable as in Comparative Example 2, the adhesion strength after heating was higher than the initial adhesion strength but was lower than that in Comparative Example 2 and therefore adhesive deposit did not occur. However, there was a large chip displacement because of the low initial adhesion strength.

The results given above show that Working Example 1 was capable of providing a heat-resistant adhesive sheet for fabricating substrateless semiconductor packages that is capable of holding chips during resin encapsulation step while reducing adhesive deposit during peeling, because the adhesive layer was cured by heating after the resin encapsulation step.

Working Example 2

42 parts of acrylonitrile-butadiene rubber (Nipol 1072) from Zeon Corporation), 53 parts of bisphenol A-type epoxy resin (Epikote 828 from Japan Epoxy Resin Co., Ltd., with a weight per epoxy equivalent of 190 g/eq), and 5 parts of imidazole (C1 1Z from Shikoku Chemicals Corporation) were blended and dissolved in an MEK solvent to a concentration of 35 wt % to prepare a bond solution. The bond solution was applied to a 35-μm-thick copper foil serving as a base material film, and was then dried at 150° C. for 3 minutes to form a bond layer having a bond thickness of 10 μm, thus forming a heat-resistant adhesive sheet for semiconductor device fabrication.

A 3 mm×3 mm Si wafer chip was placed on the heat-resistant adhesive sheet for semiconductor device fabrication, epoxy-based encapsulation resin powder (GE-740LA from Nitto Denko Corporation) was sprinkled over the sheet and the wafer chip, and then molded by heating at a temperature of 175° C. under a pressure of 3.0 kg/cm² for 2 minutes. Then the structure was heated at 150° C. for 60 minutes to accelerate curing of the resin (post-mold cure) to complete a package.

Working Example 3

24 parts of acrylonitrile-butadiene rubber (Nipol 1072) from Zeon Corporation), 65 parts of bisphenol A-type epoxy resin (Epikote 1002 from Japan Epoxy Resin Co., Ltd., with a weight per epoxy equivalent of 650 g/eq), 10 parts of phenol resin (P-180 from Arakawa Chemical Industries, Ltd.), and 1 part of triphenylphosphane (TPP from Hokko Chemical Industry) were blended and dissolved in an MEK solvent to a concentration of 35 wt % to prepare an adhesive solution. The adhesive solution was applied to a 35-μm-thick copper foil serving as the base material film, and was then dried at 150° C. for 3 minutes to form an adhesive layer having a thickness of 10 μm, thus forming a heat-resistant adhesive sheet for semiconductor device fabrication. The rest of the method for fabricating the package was the same as that in Working Example 2.

Comparative Example 4

70 parts of acrylonitrile-butadiene rubber (Nipol 1072) from Zeon Corporation), 28 parts of bisphenol A-type epoxy resin (Epikote 828 from Japan Epoxy Resin Co., Ltd., with a weight per epoxy equivalent of 190 g/eq), and 2 parts of imidazole (C1 1Z from Shikoku Chemicals Corporation) were blended and were dissolved in an MEK solvent to a concentration of 35 wt % to prepare an adhesive solution. The adhesive solution was applied to a 35-μm-thick copper foil serving as a base material film and was then dried at 150° C. for 3 minutes to form an adhesive layer having an adhesive thickness of 10 μm, thus forming a heat-resistant adhesive sheet for semiconductor device fabrication. The rest of the method for fabricating the package was the same as that in Working Example 2.

Comparative Example 5

10 parts of acrylonitrile-butadiene rubber (Nipol 1072) from Zeon Corporation), 79 parts of bisphenol A-type epoxy resin (Epikote 1002 from Japan Epoxy Resin Co., Ltd., with a weight per epoxy equivalent of 650 g/eq), 10 parts of phenol resin (P-180 from Arakawa Chemical Industries, Ltd.), and 1 part of triphenylphosphane (TPP from Hokko Chemical Industry) were blended and dissolved in an MEK solvent to a concentration of 35 wt % to prepare an adhesive solution. The adhesive solution was applied to a 35-μm-thick copper foil serving as the base material film, and was then dried at 150° C. for 3 minutes to form an adhesive layer having an adhesive thickness of 10 μm, thus forming a heat-resistant adhesive sheet for semiconductor device fabrication. The rest of the method for fabricating a package was the same as that in Working Example 2.

Results from Working Examples 2 and 3 and Comparative Examples 4 and 5 are listed in Table 2 given below.

TABLE 2

| | Unit | Working example 2 | Working example 3 | Comparative example 4 | Comparative example 5 |
|---|---|---|---|---|---|
| Initial adhesion strength to SUS304 | N/20 mm | 1.22 | 1.14 | 3.12 | 0.27 |
| Peel strength from package | N/20 mm | 0.82 | 0.72 | 2.32 | 0.21 |
| Chip displacement | mm | 0.1 | 0.1 | 1.0 | 2.9 |
| Adhesive deposit | — | Not found | Not found | Found | Not found |

As apparent from Table 2, the adhesive sheets of Working Example 2 and 3 of the present invention had an excellent demoldability and did not leave adhesive deposits. Furthermore, the adhesive sheets had sufficient initial adhesion strength to suppress chip displacement. In contrast, the adhesive sheet of Comparative Example 4 with a large amount of rubber component had sufficient initial adhesion strength but caused chip displacement during resin encapsulation because the adhesive layer was soft. In addition, the adhesive sheet had poor elasticity after cured and left adhesive deposit. The adhesive sheet of Comparative Example 5 with a small amount of rubber component had insufficient initial adhesion strength and therefore caused chip displacement during resin encapsulation.

Working Example 4

1.0 parts of epoxy-based cross-linking agent (Tetrad-C from Mitsubishi Gas Chemical Company, Inc.), 5 parts of a rosin phenolic tackifier, 50 parts of thermally expandable microspheres that form at 200° C. and toluene were uniformly blended and dissolved with 100 parts of a copolymer including ethyl acrylate-butyl acrylate-acrylic acid (20 parts-80 parts-10 parts) to prepare a coating solution.

Then, an addition reactive silicone adhesive (SD-4587L from Dow Corning Toray Co., Ltd.) was applied to a 25-μm-thick polyimide film (Kapton 100H from Du Pont-Toray Co., Ltd.) to a thickness of 5 μm and dried. The film was used as a base material layer and the adhesive composition described above was applied to the surface of the film on which the silicone adhesive was not applied and was then dried to form a heat-resistant adhesive sheet for semiconductor device fabrication with the adhesive layer having a thickness of approximately 40 μm.

The thermally expandable adhesive surface of the heat-resistant adhesive sheet for semiconductor device fabrication was fixed on a flat, smooth platform by pressure and a 5 mm×5 mm Si wafer chip was placed on the silicone adhesive surface. Epoxy-based resin powder (GE-7470LA from Nitto Denko Corporation) was sprinkled over the sheet and the wafer chip, and was then molded by heating at a temperature of 175° C. under a pressure of 400 kpa for 2 minutes. Then the structure was heated at 150° C. for 60 minutes to accelerate the curing of the resin (post-mold cure) to form a package.

Working Example 5

A package was fabricated in the same way as in Working Example 4, except that 1.0 parts of epoxy-based cross-linking agent (Tetrad-C from Mitsubishi Gas Chemical Company, Inc.), 5 parts of a rosin phenolic tackifier, and toluene were uniformly blended and dissolved with 100 parts of copolymer including ethyl acrylate-butyl acrylate-acrylic acid (20 parts-80 parts-10 parts) to prepare a coating solution.

Comparative Example 6

A package was fabricated in the same way as in Working Example 4, except that instead of the silicone adhesive of the heat-resistant adhesive sheet for semiconductor device fabrication, an adhesive composition was applied to a polyimide film (Kapton 100H from Du Pont-Toray Co., Ltd.). The adhesive composition was prepared by adding 0.6 pts.wt. of an epoxy-based cross-linking agent (Tetrad-C from Mitsubishi Gas Chemical Company, Inc.) and 2 pts.wt. of isocyanate-based cross-linking agent (Coronate L from Nippon Polyurethane Industry Co., Ltd.) to 100 pts.wt. of acrylic-based copolymer including 3 pts.wt. of acrylic acid monomer as a component monomer for 100 pts.wt. of butyl acrylate monomer.

Results from Working Examples 4 and 5 and Comparative Example 6 are listed in Table 3 given below.

TABLE 3

|  | Unit | Working Example 4 | Working Example 5 | Comparative Example 6 |
|---|---|---|---|---|
| Adhesion strength to SUS304 at 175° C. | N/20 mm | 0.67 | 0.72 | 0.15 |
| Peel strength from package | N/20 mm | 0.34 | 0.48 | 2.46 |
| Chip displacement | mm | 0.1 | 0.1 | 2.5 |
| Adhesive deposit | — | Not found | Not found | Found |

In Working Example 4, the adhesive sheet had a sufficient adhesive strength to suppress chip displacement during mold. In addition, light package peel strength was successfully achieved by using the silicone adhesive's characteristic of low adhesive strength to encapsulation resin, and therefore a good package without adhesive deposit was obtained.

In Working Example 5, the adhesive sheet had high adhesion strength at 175° C. to suppress chip displacement. In addition, light package peel strength was successfully achieved and therefore a good package without adhesive deposit was obtained.

In Comparative Example 6, chip displacement was not suppressed because of reduction in adhesive strength in a high temperature range, which is a characteristic of acrylic adhesives. The result shows that chip displacement cannot be suppressed unless the adhesive layer is a silicone adhesive layer, even though the base material layer has a sufficiently low thermal expansion coefficient. In addition, peel strength was higher than that in the working examples because of high adhesion strength to the encapsulation resin, which is polyfunctional. Consequently, adhesive deposits were left after peeling.

What is claimed is:

1. A heat-resistant adhesive sheet for semiconductor device fabrication:
    the heat-resistant adhesive sheet is bonded to a substrateless semiconductor chip during a period when the substrateless semiconductor chip is encapsulated with a resin to form a package, wherein
    the heat-resistant adhesive sheet comprises a base material layer and an adhesive layer, the adhesive layer when bonded has an adhesion strength to SUS304 greater than or equal to 0.5 N/20 mm, and the adhesive layer is cured by stimulation received in a period between completion of bonding the heat-resistant adhesive sheet to the substrateless semiconductor chip and completion of resin encapsulating the substrateless semiconductor chip so that a peel strength of the adhesive layer from the package reduces to 2.0 N/20 mm or less.

2. The heat-resistant adhesive sheet for semiconductor device fabrication according to claim 1, wherein the adhesive layer is made of a radiation curable adhesive.

3. The heat-resistant adhesive sheet for semiconductor device fabrication according to claim 1, wherein the radiation curable adhesive is an ultraviolet curable adhesive.

4. The heat-resistant adhesive sheet for semiconductor device fabrication according to claim 1, wherein the radiation curable adhesive is curable when heated.

5. The heat-resistant adhesive sheet for semiconductor device fabrication according to claim 1, wherein the adhesive layer comprises a rubber component and an epoxy resin component, the rubber component and the epoxy resin component cure in a period between completion of bonding and completion of resin encapsulation, the proportion of the rubber component in an organic substance in the adhesive is in the range of 20 to 60 wt %.

6. A method for fabricating a substrateless semiconductor package using a heat-resistant adhesive sheet for semiconductor device fabrication according to claim 1.

* * * * *